（12）United States Patent
Bian et al.

(10) Patent No.: US 7,772,672 B2
(45) Date of Patent: Aug. 10, 2010

(54) SEMICONDUCTOR CONSTRUCTIONS

(75) Inventors: Zailong Bian, Boise, ID (US); Janos Fucsko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 709 days.

(21) Appl. No.: 11/218,231

(22) Filed: Sep. 1, 2005

(65) Prior Publication Data

US 2007/0045769 A1    Mar. 1, 2007

(51) Int. Cl.
*H01L 29/00* (2006.01)
(52) U.S. Cl. .................. 257/510; 257/396; 257/397; 257/E29.02
(58) Field of Classification Search ......... 257/395–397, 257/510, E29.018, E29.02
See application file for complete search history.

(56) References Cited

U.S. PATENT DOCUMENTS

| | | | | |
|---|---|---|---|---|
| 4,356,211 | A | * | 10/1982 | Riseman .................... 438/422 |
| 4,472,240 | A | | 9/1984 | Kameyama |
| 4,533,430 | A | | 8/1985 | Bower |
| 4,639,288 | A | | 1/1987 | Price et al. |
| 4,825,277 | A | * | 4/1989 | Mattox et al. ............... 257/639 |
| 5,021,846 | A | | 6/1991 | Ueno |
| 5,801,083 | A | | 9/1998 | Yu et al. |
| 5,872,045 | A | | 2/1999 | Lou et al. |
| 5,928,428 | A | | 7/1999 | Horie |
| 5,930,595 | A | | 7/1999 | Sridhar et al. |
| 5,945,707 | A | | 8/1999 | Bronner et al. |
| 6,121,082 | A | | 9/2000 | Linliu et al. |
| 6,150,212 | A | | 11/2000 | Divakaruni et al. |
| 6,265,280 | B1 | | 7/2001 | Pan |
| 6,265,281 | B1 | | 7/2001 | Reinberg |
| 6,277,709 | B1 | | 8/2001 | Wang et al. |
| 6,322,634 | B1 | | 11/2001 | Pan |
| 6,376,893 | B1 | | 4/2002 | Rha |
| 6,383,877 | B1 | | 5/2002 | Ahn et al. |
| 6,432,843 | B1 | | 8/2002 | Kim et al. |
| 6,437,417 | B1 | | 8/2002 | Gilton |
| 6,445,072 | B1 | | 9/2002 | Subramanian et al. |
| 6,518,641 | B2 | | 2/2003 | Mandelman et al. |
| 6,541,825 | B2 | | 4/2003 | Kuroi et al. |
| 6,562,696 | B1 | | 5/2003 | Hsu et al. |

(Continued)

FOREIGN PATENT DOCUMENTS

FR    2 626 179    12/2002

(Continued)

OTHER PUBLICATIONS

US2006/026692, Int'l Preliminary Report on Patentability, dated May 29, 2008.

(Continued)

*Primary Examiner*—Matthew E Warren
(74) *Attorney, Agent, or Firm*—Wells St. John P.S.

(57) ABSTRACT

The invention includes semiconductor constructions having trenched isolation regions. The trenches of the trenched isolation regions can include narrow bottom portions and upper wide portions over the bottom portions. Electrically insulative material can fill the upper wide portions while leaving voids within the narrow bottom portions. The trenched isolation regions can be incorporated into a memory array, and/or can be incorporated into an electronic system. The invention also includes methods of forming semiconductor constructions.

31 Claims, 16 Drawing Sheets

U.S. PATENT DOCUMENTS

| | | | |
|---|---|---|---|
| 6,566,229 B2 | 5/2003 | Hong et al. | |
| 6,596,607 B2 | 7/2003 | Ahn | |
| 6,617,662 B2 * | 9/2003 | Park | 257/510 |
| 6,620,681 B1 | 9/2003 | Kim et al. | |
| 6,624,496 B2 | 9/2003 | Ku et al. | |
| 6,627,529 B2 | 9/2003 | Ireland | |
| 6,683,354 B2 * | 1/2004 | Heo et al. | 257/397 |
| 6,693,050 B1 | 2/2004 | Cui et al. | |
| 6,727,150 B2 | 4/2004 | Tang | |
| 6,753,569 B2 | 6/2004 | Lin et al. | |
| 6,780,721 B2 | 8/2004 | Farrar | |
| 6,791,155 B1 * | 9/2004 | Lo et al. | 257/506 |
| 6,841,440 B2 | 1/2005 | Kuroi et al. | |
| 6,867,098 B2 | 3/2005 | Park et al. | |
| 6,897,120 B2 | 5/2005 | Trapp | |
| 7,038,289 B2 | 5/2006 | Marty et al. | |
| 7,105,397 B2 | 9/2006 | Hieda et al. | |
| 7,196,396 B2 | 3/2007 | Ohta | |
| 7,208,812 B2 * | 4/2007 | Ohta | 257/510 |
| 7,279,377 B2 | 10/2007 | Reuger et al. | |
| 7,332,408 B2 | 2/2008 | Violette | |
| 7,332,789 B2 | 2/2008 | Violette | |
| 7,439,157 B2 | 10/2008 | Bian et al. | |
| 2002/0038901 A1 | 4/2002 | Kuroi et al. | |
| 2002/0055205 A1 | 5/2002 | Lin et al. | |
| 2002/0090795 A1 | 7/2002 | Ahn et al. | |
| 2002/0146914 A1 | 10/2002 | Huang et al. | |
| 2003/0143810 A1 | 7/2003 | Kuroi et al. | |
| 2004/0029389 A1 | 2/2004 | Lo | |
| 2004/0097077 A1 | 5/2004 | Nallan et al. | |
| 2004/0102031 A1 | 5/2004 | Kloster et al. | |
| 2004/0147093 A1 | 7/2004 | Marty et al. | |
| 2004/0224510 A1 | 11/2004 | Sandhu et al. | |
| 2004/0232496 A1 | 11/2004 | Chen et al. | |
| 2004/0235240 A1 | 11/2004 | Hsu et al. | |
| 2005/0112843 A1 | 5/2005 | Fischer et al. | |
| 2005/0161729 A1 | 7/2005 | Dong et al. | |
| 2005/0287731 A1 | 12/2005 | Bian et al. | |
| 2006/0255426 A1 * | 11/2006 | Inoue et al. | 257/510 |
| 2007/0170528 A1 | 7/2007 | Partridge et al. | |
| 2008/0128781 A1 | 6/2008 | Violette | |

FOREIGN PATENT DOCUMENTS

| | | |
|---|---|---|
| JP | 2206175 | 8/1990 |
| KR | 2000075409 | 12/2000 |
| KR | 20020027161 | 4/2002 |
| WO | WO85/03041 | 7/1985 |
| WO | WO 2006/043455 | 3/2006 |
| WO | WO 2006/026692 | 8/2006 |
| WO | 2006/026692 | 10/2006 |

OTHER PUBLICATIONS

Shin, S.H., et al. "Data Retention Time and Electrical Characteristics of Cell Translator According to STI Materials in 90 nm DRAM" Journal of he Korean Physical Sodaty, vol. 43, No. 6, pp. 887-891 Nov. 2003.

Hong, S.H., et al. "A Novel T-Shaped Shallow Trench Isolation Technology" Apr. 2001 The Japan Society of Applied Physics.

Final Office Action mailed Apr. 16, 2008 for Patent No. 7439157 filed Oct. 21, 2008; Zailong Bian et al.

Non-Final Office Action mailed Oct. 15, 2007 for Patent No. 7439157 filed Oct. 21, 2008; Zailong Bian et al.

Preliminary Amendment for application U.S. Appl. No. 11/962,967 filed Jan. 31, 2008; Mike Violette.

Specification and Drawings for U.S. Appl. No. 11/962,967, filed Dec. 21, 2007; Mike Violette.

* cited by examiner

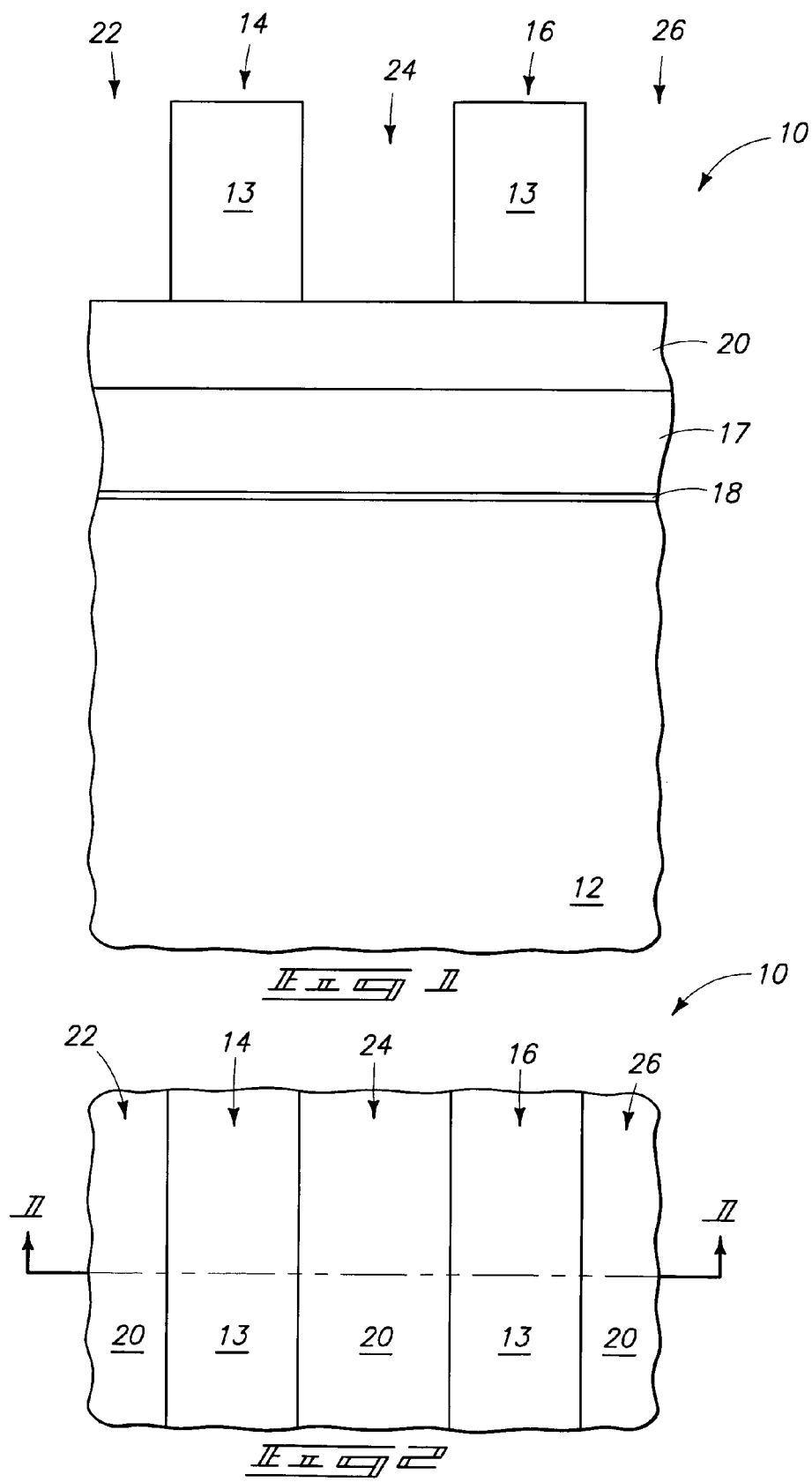

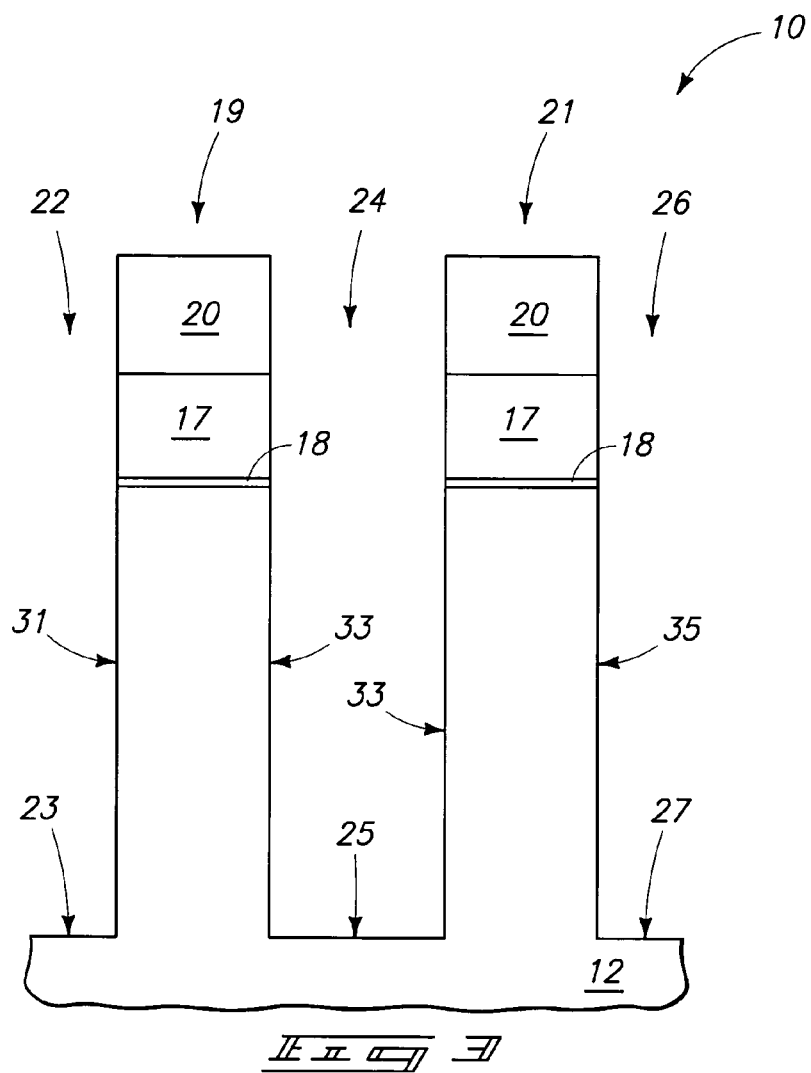
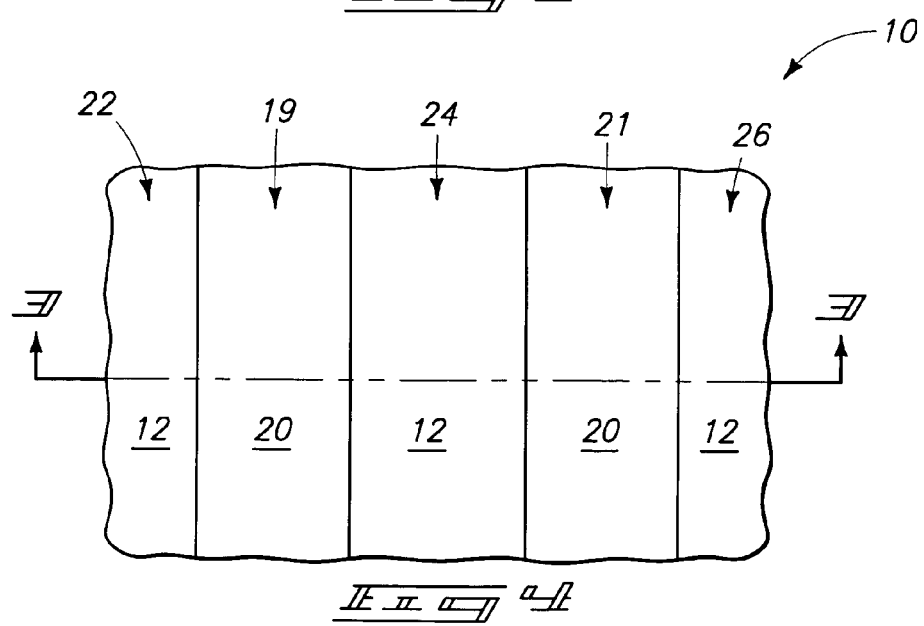

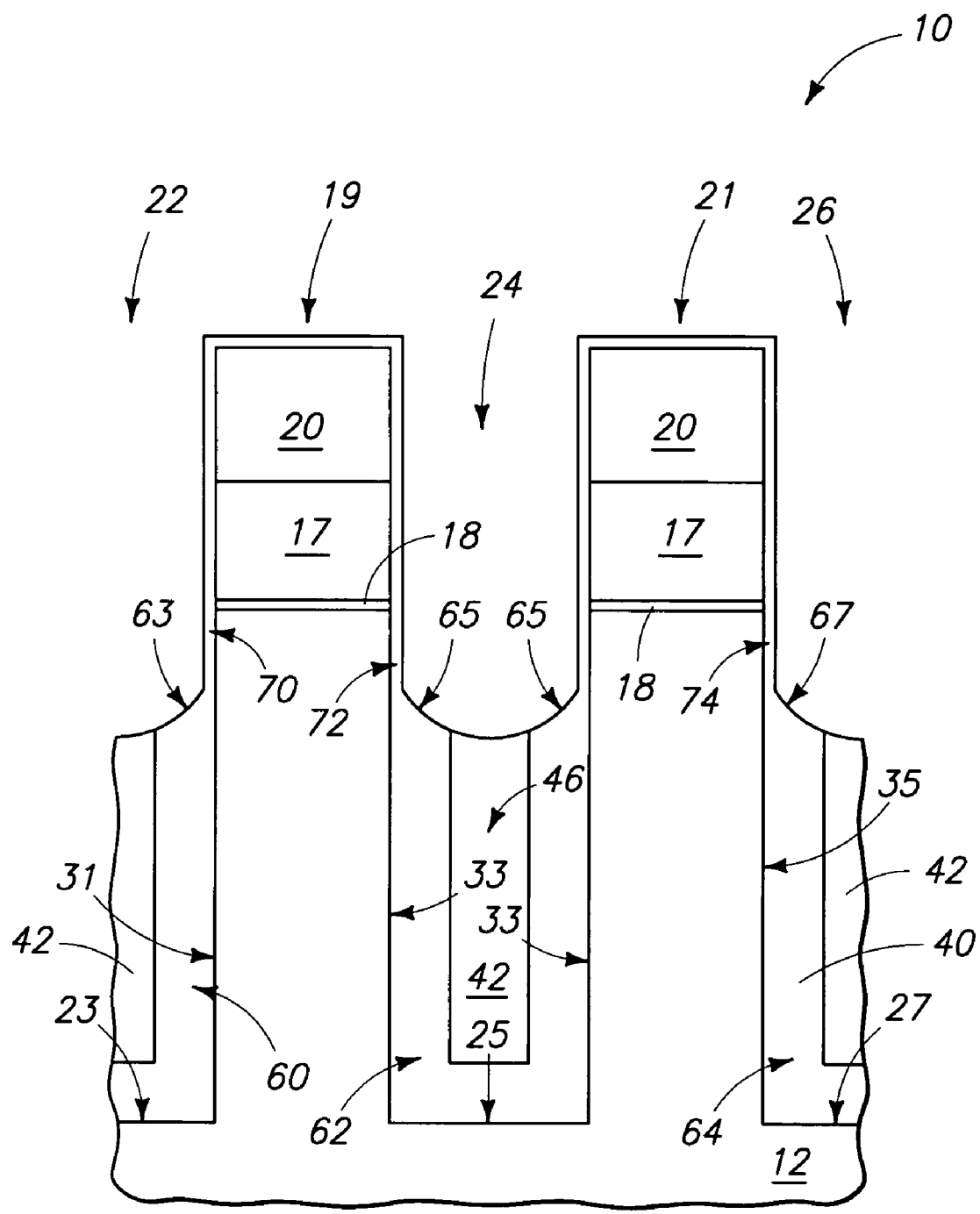

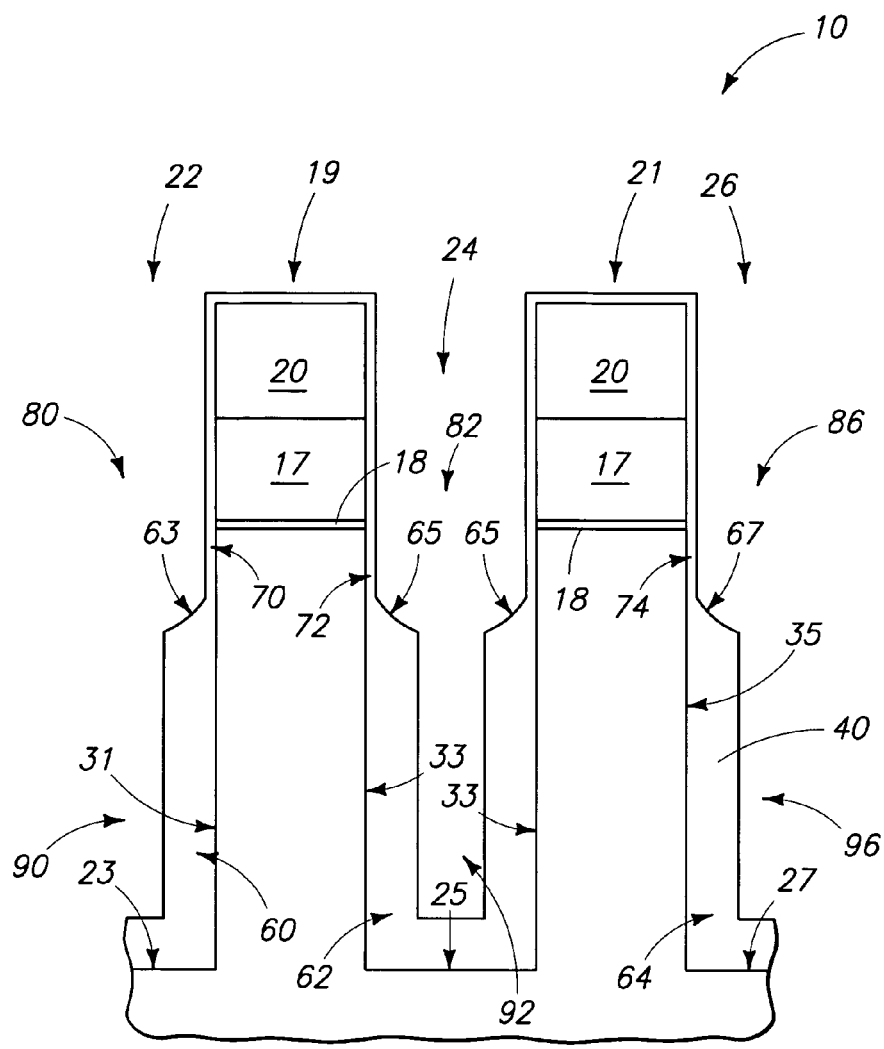
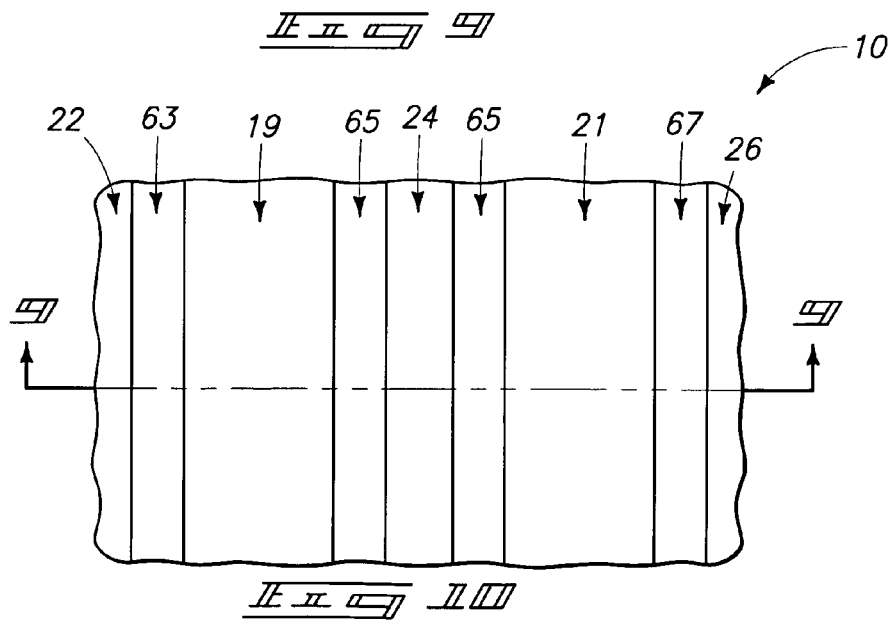

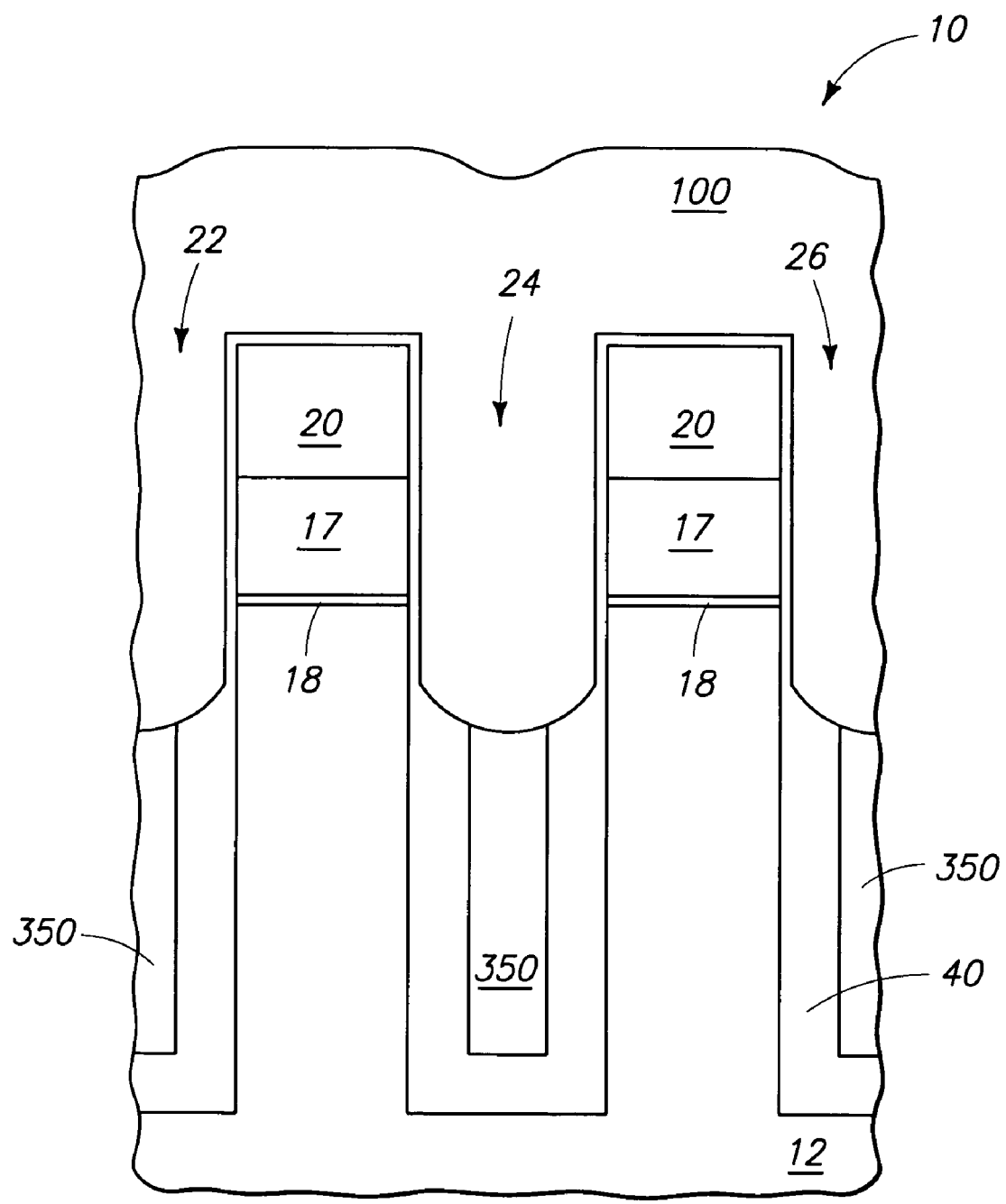

SEMICONDUCTOR CONSTRUCTIONS

TECHNICAL FIELD

The invention pertains to semiconductor constructions, memory arrays, electronic systems, and methods of forming semiconductor constructions.

BACKGROUND OF THE INVENTION

Trenched isolation regions (such as, for example, shallow trench isolation regions) are commonly utilized in integrated circuitry for electrically isolating electrical components from one another. The isolation regions extend into a semiconductor substrate, and comprise insulative material formed within trenches that have been etched into the substrate.

High density plasma (HDP) oxide has been widely used in trenched isolation regions. A problem that can occur during formation of trenched isolation regions is that voids can become trapped in the trenches during deposition of the insulative material within the trenches. The voids will have dielectric properties different than that of the insulative material, and accordingly will alter the insulative properties of the isolation regions. The voids can also cause issues with further processing steps if the voids are exposed at any time during the processing steps. In response to these problems, numerous technologies have been developed for eliminating void formation within trenched isolation regions.

It is becoming increasingly difficult to eliminate void formation with increasing levels of integration (in other words, with the continuous shrinking of feature sizes with each new generation). Specifically, trenched isolation regions are becoming narrower and deeper with each device generation, which renders it more difficult to uniformly fill the trenched isolation regions with insulative material.

In light of the above-discussed difficulties, it would be desirable to develop new methods for fabrication of trenched isolation regions which alleviate problems associated with voids. Although the invention described herein was motivated, at least in part, by the desire to alleviate problems associated with void formation in trenched isolation regions, persons of ordinary skill in the art will understand upon reading this disclosure and the claims that follow that aspects of the invention can have applications beyond trenched isolation regions.

SUMMARY OF THE INVENTION

In one aspect, the invention includes a semiconductor construction. The construction comprises a semiconductor substrate having a trench extending therein. A liner is along an interior of the trench and narrows the trench. The liner comprises a thick bottom portion and a thin upper portion over the bottom portion. The upper portion joins the bottom portion at a step. The lined trench has a wide upper portion joining a constricted lower portion at said step. A substantially solid electrically insulative material substantially fills the lined trench, and has a different composition from the liner.

In one aspect, the invention includes a memory array (such as, for example, a FLASH memory array). The array comprises a plurality of charge storage cells supported by a semiconductor substrate, and a plurality of isolation regions extending within the substrate and providing electrical isolation for the cells. At least some of the individual isolation regions are contained within electrically insulative liners and comprise lower narrow portions joining to upper wide portions at steps. At least some of the individual isolation regions also comprise substantially solid insulative material within the narrow portions and wide portions, and comprise voids substantially entirely contained within the narrow portions.

In one aspect, the invention includes an electronic system containing a processor and a memory device in data communication with the processor. At least one of the memory device and processor includes one or more electrical isolation regions contained within electrically insulative liners and comprising lower narrow portions joining to upper wide portions at steps. The one or more electrical isolation regions contain a non-gaseous material within the narrow portions and wide portions, and have voids substantially entirely contained within the narrow portions.

In one aspect, the invention includes a method of forming a semiconductor construction. A semiconductor substrate is provided. A trench is formed in the substrate, with the trench having a lower region and an upper region over the lower region. A liner is formed within the trench to narrow the trench. A sacrificial material is provided which is along the liner within the lower region of the trench and not along the liner within the upper region of the trench. While the sacrificial material is along the liner within the lower region of the trench, the thickness of the liner along the upper region of the trench is reduced. The sacrificial material is removed, and an electrically insulative material is formed within the trench and along the liner. The electrically insulative material substantially fills the upper region of the trench and leaves a void within the lower region of the trench.

In one aspect, the invention includes another method of forming a semiconductor construction. A semiconductor substrate is provided, and a trench is formed in the substrate. The trench is partially filled with a first material to narrow the trench. The first material has a first thickness. The thickness of the first material is reduced along an upper region of the trench while the thickness of the first material along a lower region of the trench remains at the first thickness. After the reduction of the thickness of the first material along the upper region of the trench, the trench has a wide upper portion joining a constricted lower portion at a step. Electrically insulative second material is formed within the narrowed trench. The electrically insulative second material substantially fills the wide upper portion and leaves a void within the constricted lower portion.

In one aspect, the invention includes yet another method of forming a semiconductor construction. A semiconductor substrate is provided. A trench is formed in the substrate. The trench has a lower region and an upper region over the lower region. A liner is formed within the trench to narrow the trench. Non-oxidized silicon is provided to be along the liner within the lower region of the trench and not along the liner within the upper region of the trench. While the non-oxidized silicon is along the liner within the lower region of the trench, the thickness of the liner is reduced along the upper region of the trench. The non-oxidized silicon is converted to silicon dioxide. After the thickness of the liner along the upper region of the trench is reduced, electrically insulative material is formed over the silicon dioxide to fill the upper region of the trench.

In one aspect, the invention includes yet another method of forming a semiconductor construction. A semiconductor substrate is provided. A pair of openings are formed to extend into the substrate. The individual openings have upper regions and lower regions, and are spaced from one another by a pedestal of the substrate. Liners are formed within the openings. Widths of the liners within the upper regions of the openings are reduced relative to the widths of the liners within the lower regions of the openings. After the widths of the liners are reduced, electrically insulative material is formed within the openings and along the liners. The electrically insulative material substantially fills the upper regions of the openings and leaves voids within the lower regions of the openings. A transistor is formed which has a gate over the pedestal of the semiconductor substrate.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment shown at a preliminary processing stage of an exemplary aspect of the present invention.

FIG. 2 is a top view of a portion of a semiconductor construction comprising the cross-section of FIG. 1 along the line 1-1.

FIG. 3 is a view of the semiconductor wafer fragment of FIG. 1 shown at a processing stage subsequent to that of FIG. 1.

FIG. 4 is a top view of a portion of a semiconductor construction comprising the cross-section of FIG. 3 along the line 3-3.

FIG. 8 is a view of the FIG. 1 wafer fragment shown at a processing stage subsequent to that of FIG. 7.

FIG. 9 is a view of the FIG. 1 wafer fragment shown at a processing stage subsequent to that of FIG. 8.

FIG. 10 is a top view of a portion of a semiconductor construction comprising the cross-section of FIG. 9 along the line 9-9.

FIG. 17 is a view of the FIG. 16 wafer fragment shown at a processing stage subsequent to that of FIG. 16.

DETAILED DESCRIPTION OF THE PREFERRED EMBODIMENTS

Figure 5:
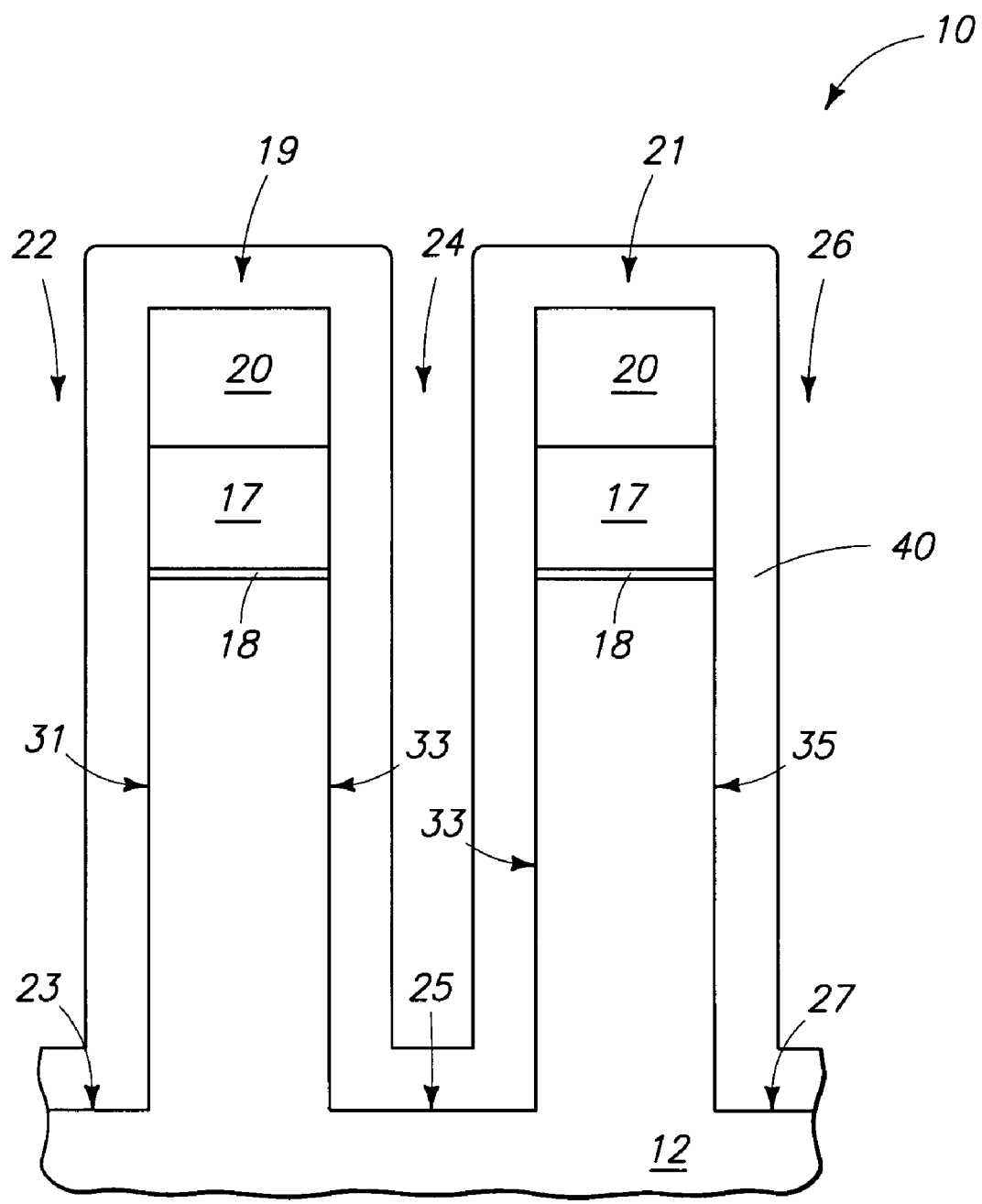
FIG. 5 is a view of the FIG. 1 wafer fragment shown at a processing stage subsequent to that of FIG. 3.

This disclosure of the invention is submitted in furtherance of the constitutional purposes of the U.S. Patent Laws "to promote the progress of science and useful arts" (Article 1, Section 8).

High density plasma (HDP) oxide has been traditionally used for shallow trench isolation (STI) fill due to the high oxide quality and good fill capability. However, the HDP fill capability can be severely challenged as device feature sizes continue to shrink. At a 50 nanometer node, the STI structure is typically only 50 nanometers wide and approximately 3000 Å deep. It can be extremely difficult to fill an opening of such high aspect ratio with HDP.

When HDP is utilized to fill openings having high aspect ratios, voids can form within the openings. HDP is a simultaneous deposition and etch process, with silicon and oxygen atoms impinging on a surface to form a silicon dioxide film. Energetic particles can sputter from a surface of the film. This can keep openings from pinching off so that the bottom regions of the openings can be filled while avoiding trapping of voids within the openings. However, as gap widths become smaller and aspect ratios become greater, another phenomena can become increasingly problematic: Specifically, atoms sputtered off of one side of an opening can become redeposited on another side of the opening. This can cause an early pinch-off of the openings before the bottom regions of the openings are completely filled. Such results in void formation within the openings. Void formation at inappropriate locations can cause device functionality issues, and also integration issues.

In some aspects of the present invention, openings are designed to force voids to occur at relatively low positions within the openings. Specifically, the openings are designed to have narrow portions at their lowest-most regions, and wider portions above the narrow portions. The narrow portions can be created in STI trenches using an appropriate spacer, and sacrificial material (such as, for example, polycrystalline silicon). In some aspects, the wide portions are subsequently filled with an HDP fill process, and the wide portions can have appropriate aspect ratios to be easily uniformly filled by HDP-deposited oxide.

Exemplary aspects of the present invention are described below with reference to FIGS. 1-22.

Referring initially to FIG. 1, a semiconductor construction 10 is illustrated at a preliminary processing stage. The construction 10 comprises a semiconductor substrate 12 having layers 17, 18 and 20 thereover. Layer 18 can be an oxide-containing layer 18, layer 17 can containing silicon, and layer 20 can be a nitride-containing layer. Oxide-containing layer 18, can, for example, comprise, consist essentially of, or consist of silicon dioxide; layer 17 can comprise. consist essentially of, or consist of polycrystalline silicon (typically conductively-doped at the processing stage of FIG. 1), and nitride-containing layer 20 can, for example, comprise, consist essentially of, or consist of silicon nitride. Other layers can be utilized in addition to, or alternatively to, the layers 17, 18 and 20 in various aspects of the invention (not shown).

Substrate 12 can comprise, consist essentially of, or consist of any appropriate semiconductor material. In particular aspects, substrate 12 can comprise bulk monocrystalline silicon lightly-doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A patterned masking material 13 is over the layers 17, 18 and 20, and such defines a patterned mask. The masking material can be any suitable material, and in some aspects is photolithographically patterned photoresist. The patterned mask is shown to comprise a pair of masking blocks 14 and 16. Openings 22, 24 and 26 are between and beside the masking blocks, and extend to an uppermost surface of substrate 12.

FIG. 2 shows a top view of the construction 10. Such shows that the masking blocks 14 and 16 can be lines extending across a surface of substrate 12, and that the openings 22, 24 and 26 can extend longitudinally across the surface of layer 20.

Referring to FIGS. 3 and 4, openings 22, 24 and 26 are extended through layers 17, 18 and 20, and into substrate 12 so that the openings now become trenches extending into the substrate, and masking material 13 (FIGS. 1 and 2) is removed. The extension of the openings through the layers and into the substrate forms patterned lines 19 and 21 from the layers 17, 18 and 20; and forms linear pedestals of the substrate 12 beneath the patterned lines.

The openings can be extended through the layers and into the substrate with any suitable etch, or combination of etches, and to any suitable depth. In some aspects, the openings will be extended into the substrate to a depth of at least about 1 micron.

The trenches 22, 24 and 26 terminate at bottom-most surfaces 23, 25 and 27, respectively; and have substantially vertical sidewalls 31, 33 and 35 extending upwardly from such bottom-most surfaces.

Referring to FIG. 5, a material 40 is provided within trenches 22, 24 and 26 to partially fill the trenches, and thus narrow the trenches. Material 40 can comprise any suitable composition or combination of compositions, and typically will be electrically insulative. In exemplary aspects, material 40 can comprise, consist essentially of, or consist of silicon dioxide. In other exemplary aspects, material 40 can comprise multiple layers, as will be discussed in more detail below with reference to FIGS. 20 and 21. If material 40 comprises a single composition, the material can be substantially homogeneous. In aspects in which material 40 comprises two or more layers, such layers can have different compositions and/or other properties relative to one another so that one of layers can be selectively removed relative to another of the layers.

In the aspect of the invention of FIG. 5, material 40 extends over and along masking blocks 14 and 16, as well as extending within the trenches 22, 24 and 26.

If material 40 comprises, consists essentially of, or consists of silicon dioxide, such material can be formed by appropriate deposition of silicon dioxide, such as, for example, deposition from tetraethyl orthosilicate (TEOS). The material 40 can be formed to be conformal along the surfaces 23, 25, 27, 31, 33 and 35, as shown. Another method which can be used to form material 40 is thermal oxidation of exposed materials along surfaces 23, 25, 27, 31, 33 and 35. Such oxidation can form an entirety of the material 40 in some aspects, and in other aspects can form only a portion of material 40. In aspects in which the thermally-grown layer is only a portion of material 40, another portion of material 40 can be deposited over the thermally-grown portion.

Material 40 can be formed to any suitable thickness, and in particular aspects can be formed to a thickness of from about 100 Å to about 200 Å. In some aspects, the material 40 can be formed to a thickness that covers about two-thirds of a total width of an individual trench in the shown cross-sectional view. In other words, the material 40 can be formed to a thickness such that the material fills about two-thirds of the total cross-sectional width of a trench (such as, for example, the trench 24).

In some aspects of the invention, material 40 can be referred to as a liner, in that the material is lining the bottommost surfaces and vertical surfaces of the trenches 22, 24 and 26.

Figure 6:
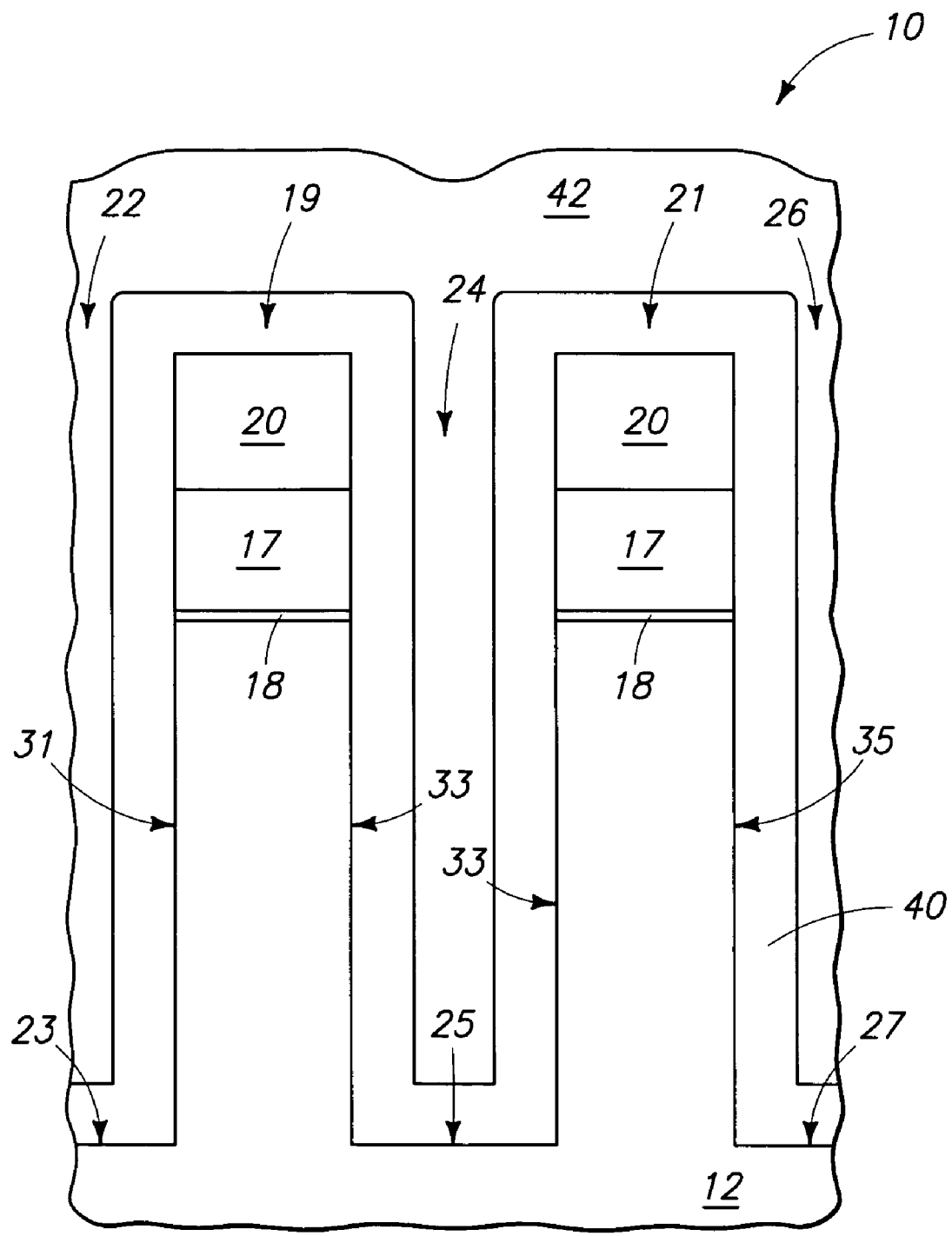
FIG. 6 is a view of the FIG. 1 wafer fragment shown at a processing stage subsequent to that of FIG. 5.

Referring to FIG. 6, a material 42 is formed over the liner 40 and within trenches 22, 24 and 26. In some aspects, liner 40 can be referred to as a first material, and material 42 can be referred to as a second material. In particular aspects, material 42 can ultimately be removed entirely from within the trenches 22, 24 and 26, and in such aspects material 42 can be referred to as a sacrificial material. If material 42 is sacrificial, the material can be either electrically insulative or electrically conductive.

Material 42 preferably has excellent fill properties so that the material uniformly fills the trenches 22, 24 and 26. An exemplary material having suitable flow properties is polycrystalline silicon. Thus, material 42 can, in particular aspects, comprise, consist essentially of, or consist of silicon, and in some aspects can comprise, consist essentially of, or consist of polycrystalline silicon. The silicon can be either undoped (i.e., can have a dopant concentration of less than or equal to about $10^{17}$ atoms/cm$^2$) or can be doped with either p-type or n-type dopant. If liner 40 comprises silicon dioxide, it can be advantageous for the silicon of material 42 to be either undoped or n-type doped, in that such can be easier to selectively remove relative to silicon dioxide than is p-type doped silicon in a uniform and controlled fashion.

Figure 7:
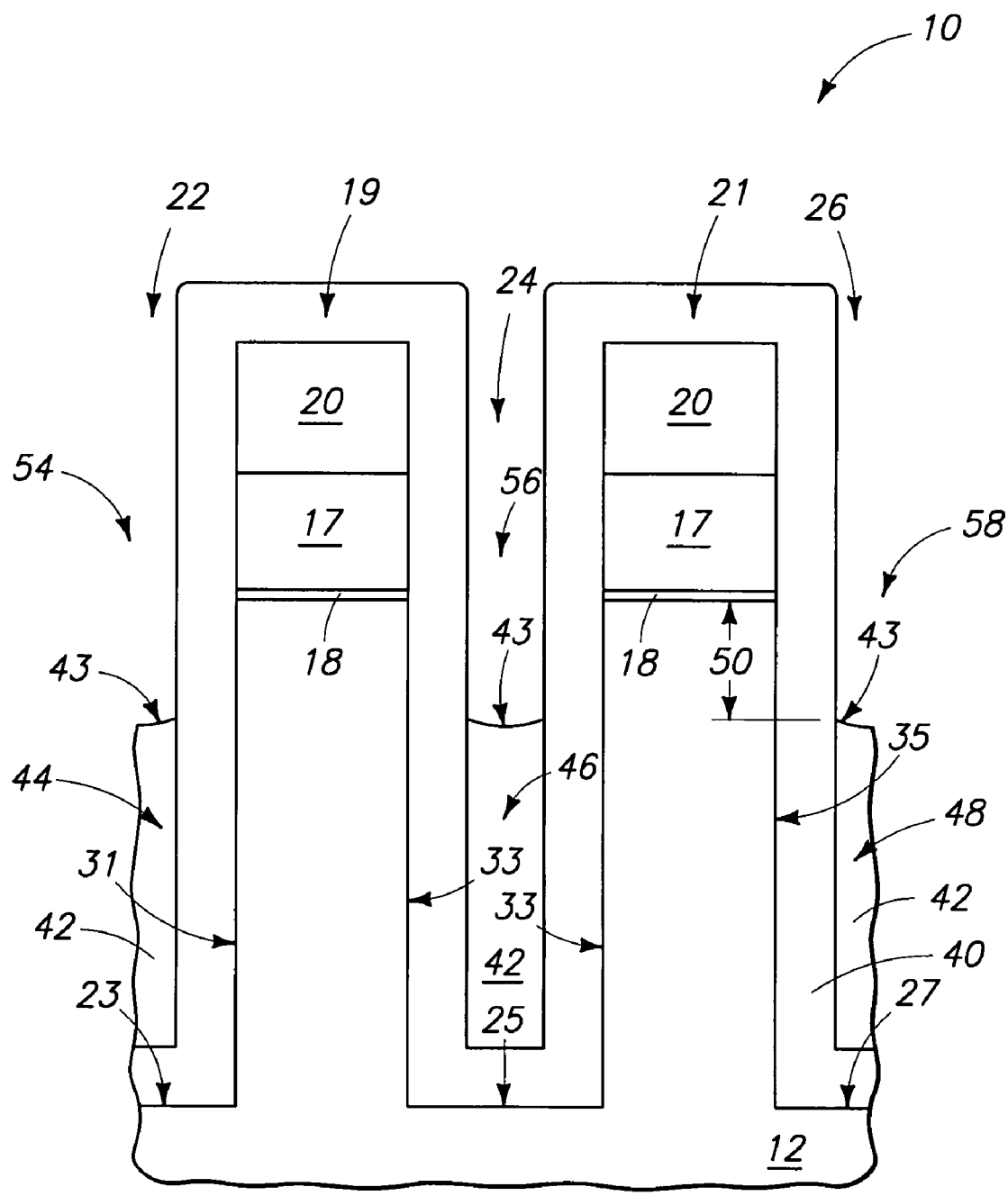
FIG. 7 is a view of the FIG. 1 wafer fragment shown at a processing stage subsequent to that of FIG. 6.

Referring to FIG. 7, some of the material 42 is removed to leave the material only within the lower portions of the trenches 22, 24 and 26. In some aspects, the trenches can be considered to have lower regions and upper regions over such lower regions. The locations of the lower regions can be defined by the material 42 remaining at the processing stage of FIG. 7, in that such material can be considered to fill the lower regions of the trenches while leaving the upper regions of the trenches exposed. Thus, trenches 22, 24 and 26 can be considered to comprise lower regions 44, 46 and 48 respectively, with such lower regions being regions containing the remaining portions of material 42; and to comprise upper regions 54, 56 and 58 respectively, with such upper regions being portions of the trenches above the remaining material 42. If material 42 consists of polycrystalline silicon and liner 40 consists of silicon dioxide, the material 42 can be selectively etched relative to the liner with an NH$_4$F-based wet etch.

In particular aspects, the processing stage of FIG. 7 can be considered to comprise material 42 provided to be along material 40 (or alternatively liner 40) within lower regions of the trenches, and to not be along the material 40 within upper regions of the trenches. The portion of material 40 against material 42 can be considered to be a bottom portion of the material, and the portion of the material 40 that is above material 42 can be considered to be an upper portion.

The material 42 remaining at the processing stage of FIG. 7 has uppermost surfaces 43 at a depth 50 beneath the uppermost surfaces of substrate 12. Ultimately, such depth will determine a depth to which voids present in isolation regions will be beneath gate oxide associated with transistor devices. It can be preferred that such depth be at least 200 Å, and in particular aspects, such depth can be from about 200 Å to about 1000 Å.

The shown uppermost surface 43 is in a concave shape, which can result from some etching processes. It is to be understood that the uppermost surface 43 can alternatively comprise numerous other configurations, including a flat shape or a convex shape.

Referring to FIG. 8, material 42 protects liner 40 within lowermost regions of trenches 22, 24 and 26 while the liner in the uppermost regions of the trenches is exposed to an etch which reduces a thickness of the liner. In the shown aspect, the reduction in the thickness of the liner does not entirely remove the liner from the uppermost regions of the trenches, but it is to be understood that the invention can also encompass aspects (not shown) in which the reduction of the thickness of the liner entirely removes the liner from the uppermost regions of the trenches.

The liner remaining at the processing stage of FIG. 8 has a thick bottom portion within each of the trenches (with such bottom portions being labeled 60, 62 and 64 within the trenches 22, 24 and 26, respectively); and has thin upper portions over such bottom portions (with the thin upper portions being labeled 70, 72 and 74 within the trenches 22, 24 and 26, respectively). The thin upper portions join the thick bottom portions at steps (with the steps being labeled 63, 65 and 67 in the trenches 22, 24 and 26, respectively). In some aspects, the liner within the lower portions can be considered to comprise substantially vertical sidewalls, and the steps 63, 65 and 67 can extend substantially perpendicularly to such sidewalls. In other aspects, such as the shown aspect, the steps can extend non-perpendicularly to the such sidewalls. It can be advantageous that the steps be relatively abrupt, in that the transition between the wide lower portions of the liners and the narrow upper portions of the liners ultimately defines void-trapping regions in some aspects of the invention.

The thicknesses of the upper portions 70, 72 and 74 of the liner 40 can, in some aspects, be reduced to a final thickness of from about 10 Å to about 100 Å, with the typical final thickness being about 30 Å. In some aspects of the invention, the reduction in thickness of the upper portions of the liner reduces the thickness of the upper portions of the liner from a first thickness to a second thickness which is from about 10% to about 50% of the first thickness.

Referring to FIGS. 9 and 10, material 42 (FIG. 8) is removed with an etch which is selective for material 42 relative to liner 40. For purposes of interpreting this disclosure and the claims that follow, an etch is considered to be selective for one material relative to another if the etch removes said one material at a faster rate than said other material, which can include, but is not limited to, etches which are 100% selective for one material relative to another. In aspects in which liner 40 comprises silicon dioxide and sacrificial material 42 comprises non-oxidized silicon, the etch utilized to remove material 42 can be a NH$_4$F-based wet etch.

The construction of FIGS. 9 and 10 comprises trenches 22, 24 and 26 having wide upper portions 80, 82 and 86 joined to constricted lower portions 90, 92 and 96. Thus, the liners 40 have changed the internal shapes of the trenches from the initial shape at the processing stage of FIG. 1 having substantially vertical sidewalls to a new shape having constricted lower portions joining to wide upper portions.

As discussed previously, liner 40 can be homogeneous, and accordingly the liner can have the same composition at the upper portions 70, 72 and 74 above the steps, as at the lower portions 60, 62 and 64 beneath the steps. In other aspects (discussed below with reference to FIGS. 14 and 15) the liner can comprise multiple layers, and one of the layers can be substantially removed from the upper portions of the liners at the processing stage of FIG. 9 while remaining in the lower portions of the liners so that the lower (or bottom) portions of the liners comprise a different composition than the upper portions of the liners.

Figure 11:
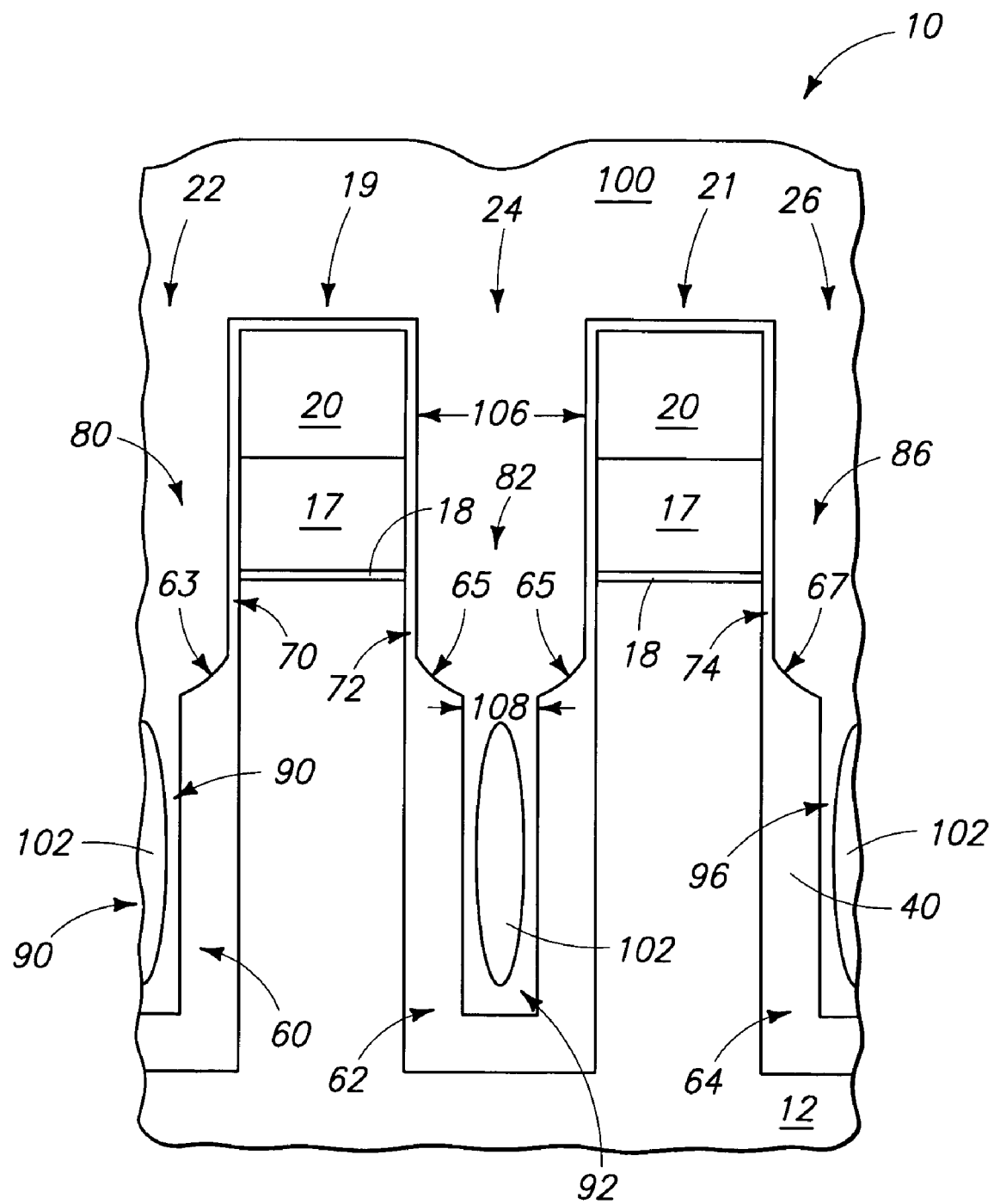
FIG. 11 is a view of the FIG. 1 wafer fragment shown at a processing stage subsequent to that of FIG. 9.

Referring to FIG. 11, a material 100 is provided within trenches 22, 24 and 26. The material 100 can be an electrically insulative material, and in particular aspects can comprise, consist essentially of, or consist of silicon dioxide. For instance, material 100 can be HDP-deposited silicon dioxide.

The widened upper portions 80, 82 and 86 of trenches 22, 24 and 26 have appropriate widths and aspect ratios so that the material 100 uniformly fills such widened upper portions. In contrast, the narrow lower portions 90, 92 and 96 of the trenches are too narrow for the material 100 to uniformly fill them, and so voids 102 are formed within the lower portions. The abrupt transition between the lower portions and upper portions accomplished with the steps 63, 65 and 67 enables the voids to be controllably formed to be retained within the narrow portions.

The trench 24 is shown having a width 106 of the wide portion 82 and a width 108 of the narrow portion 92. In particular aspects, the width 106 will be greater than or equal to about 60 nanometers and the width 108 will be less than or equal to about 30 nanometers. In some aspects, the width 108 will be less than or equal to about 70% of the width 106, and in typical aspects will be from about 20% to about 70% of the width 106. In other words, the trench 24 in the shown cross-sectional view will have a constricted lower portion that is typically from about 20% to about 70% as wide as an upper wide portion.

The material 100 can, in some aspects, be referred to as a "substantially solid" material. Such indicates that the material 100 can be, but is not limited to, pure solids, and accordingly can comprise gelatinous materials and other semi-solid materials, including, for example, various glasses. The material 100 can comprise any suitable composition or combination of compositions, and although it is shown to be substantially homogeneous, can comprise multiple layers. In particular aspects, material 100 is an electrically insulative material suitable for trenched isolation regions, and in such aspects can, for example, comprise, consist essentially of, or consist of silicon dioxide The narrow portions 90, 92 and 96 of the trenches define locations where voids 102 are formed within the trenches. Specifically, the voids will be substantially entirely retained within the narrow portions, with the term "substantially entirely retained within the narrow portions" meaning that the vast majority of the volume of a void is retained within a narrow portion. More specifically, such phrase means that at least about 75% of the volume of a void is retained within a narrow portion. In some aspects, the entirety of a void will be retained within the narrow portion of an trench. In other words, the entirety of the void will be at or below the elevational level of the steps which join the narrow portion to the wide portion (for example, the steps 63, 65 and 67 of FIG. 11).

Utilization of appropriate steps can provide clear delineation between the wide portions of the trenches and the narrow portions of the trenches, which can assist in forcing the voids to be retained substantially entirely within the narrow portions. In contrast, utilization of steps having a very gradual slope between the narrow portion of a trench and the wide portion of the trench can create difficulty in controlling the location of voids within the trenches. It is to be understood, however, that any steps can be used which are suitable for delineating the narrow portions relative to the wide portions so that voids can be controllably retained within the particular regions of the trenches. Further, although the shown steps are only single steps between the wide portions of the openings and the narrow portions, it is to be understood that the invention also encompasses aspects in which multiple steps are provided between the widest portion of an opening and the narrowest portion of an opening. In such aspects, the opening can still be considered to have "a" step between the wide portion and the narrow portion, but such step will be one of a plurality of steps between the wide portion and the narrow portion.

Voids 102 can contain any material which differs from the material 100. Thus, the term "void" is utilized to refer to regions devoid of material 100, but not necessarily devoid of other matter. The difference between the material of the voids and the material 100 can be, for example, differences in one or more of phase, density, and chemical composition. In some aspects of the invention, the voids 102 can be gaseous regions, and material 100 can be a non-gaseous material. If material 100 seals the voids from the atmosphere exterior of material 100, the particular gas within the voids can be the ambient present during deposition of material 100, and/or gases formed by out-gassing from material 100 during deposition of the material 100.

In some aspects, material 100 can comprise substantially the same composition as liner 40. For instance, liner 40 can consist essentially of, or consist of silicon dioxide, and material 100 can also consist essentially of or consist of silicon dioxide. In other aspects, liner 40 can comprise a different composition and/or density than material 100. For instance, in some aspects at least a portion of liner 40 can consist essentially of, or consist of silicon nitride, while material 100 consists essentially of, or consists of silicon dioxide.

Figure 12:
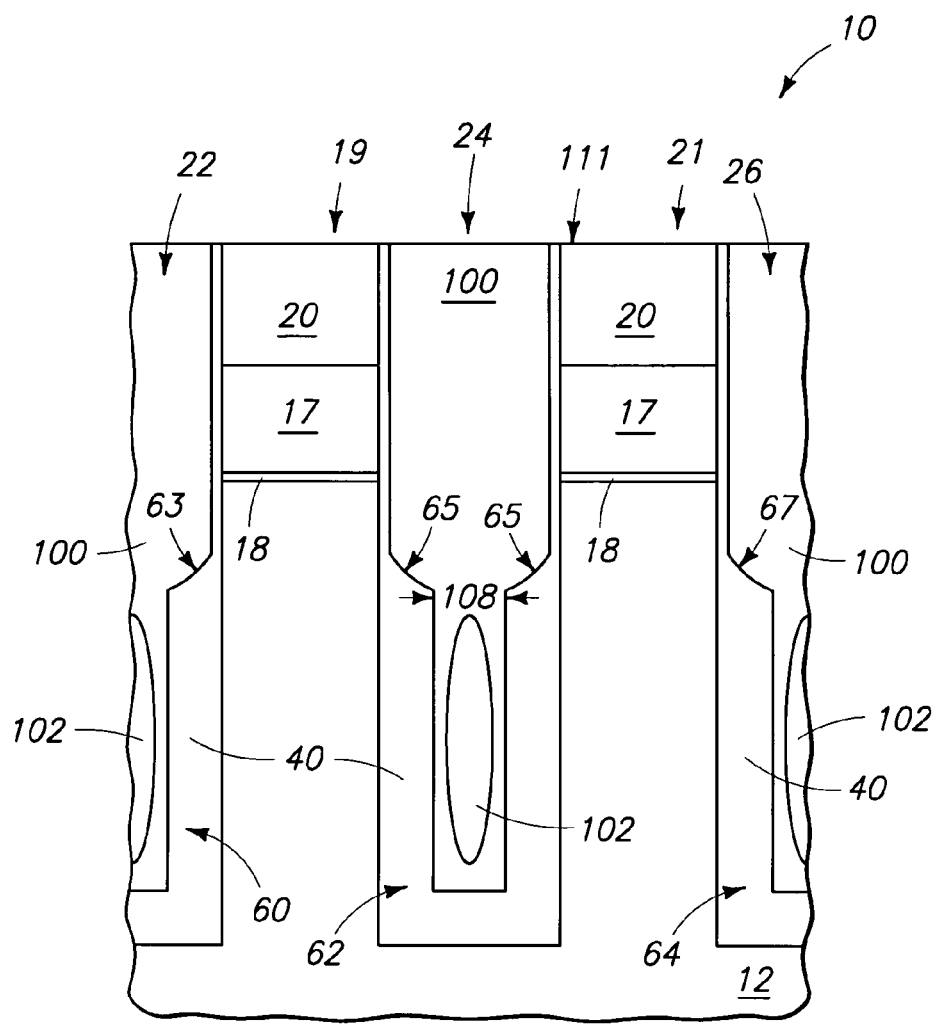
FIG. 12 is a view of the FIG. 1 wafer fragment shown at a processing stage subsequent to that of FIG. 11.

Referring to FIG. 12, construction 10 is subjected to planarization to form a planarized upper surface 111. The planarized upper surface extends across the material 100 within trenches 22, 24 and 26, as well as across regions between the trenches.

Figure 13:
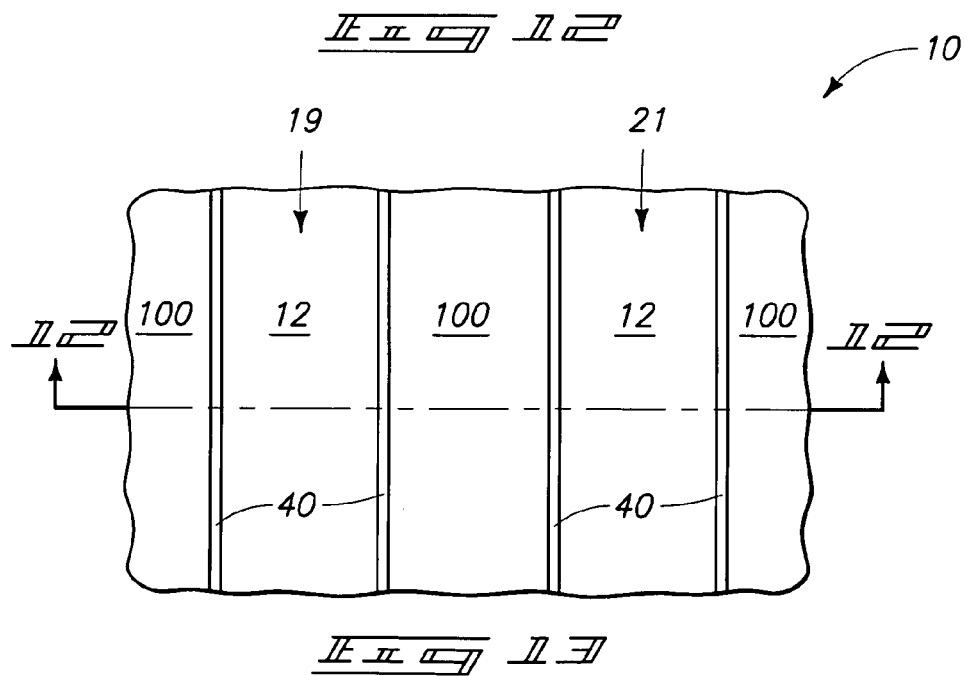
FIG. 13 is a view of a semiconductor construction comprising the cross-section of FIG. 12 along the line 12-12.

FIG. 13 is a top view of the construction 10 at the processing stage of FIG. 12.

In some aspects, materials 40 and 100 are electrically insulative, and form trenched isolation regions within the trenches 22, 24 and 26. In such aspects, the voids 102 can also be considered to be part of the trenched isolation regions. It can be advantageous to incorporate voids into trenched isolation regions in that the voids will typically have very low dielectric constants, which can be desired for some applications of trenched isolation regions.

The trenched isolation regions within trenches 22, 24 and 26 can be referred to as first, second and third trenched isolation regions respectively. Any suitable circuitry can be formed proximate the trenched isolation regions to incorporate the trenched isolation regions into an integrated circuit construction. For instance, the silicon-containing material 17 can be utilized as gate material of transistors, with source/drain regions of the transistors being formed out of the plane of the cross-section of FIG. 12. The trenched isolation regions can be utilized to electrically isolate the transistors from one another. In particular aspects, such transistors can be incorporated into FLASH devices. The FLASH devices can be fabricated as conventional devices, utilizing methodologies known to persons of ordinary skill in the art.

Figure 14:
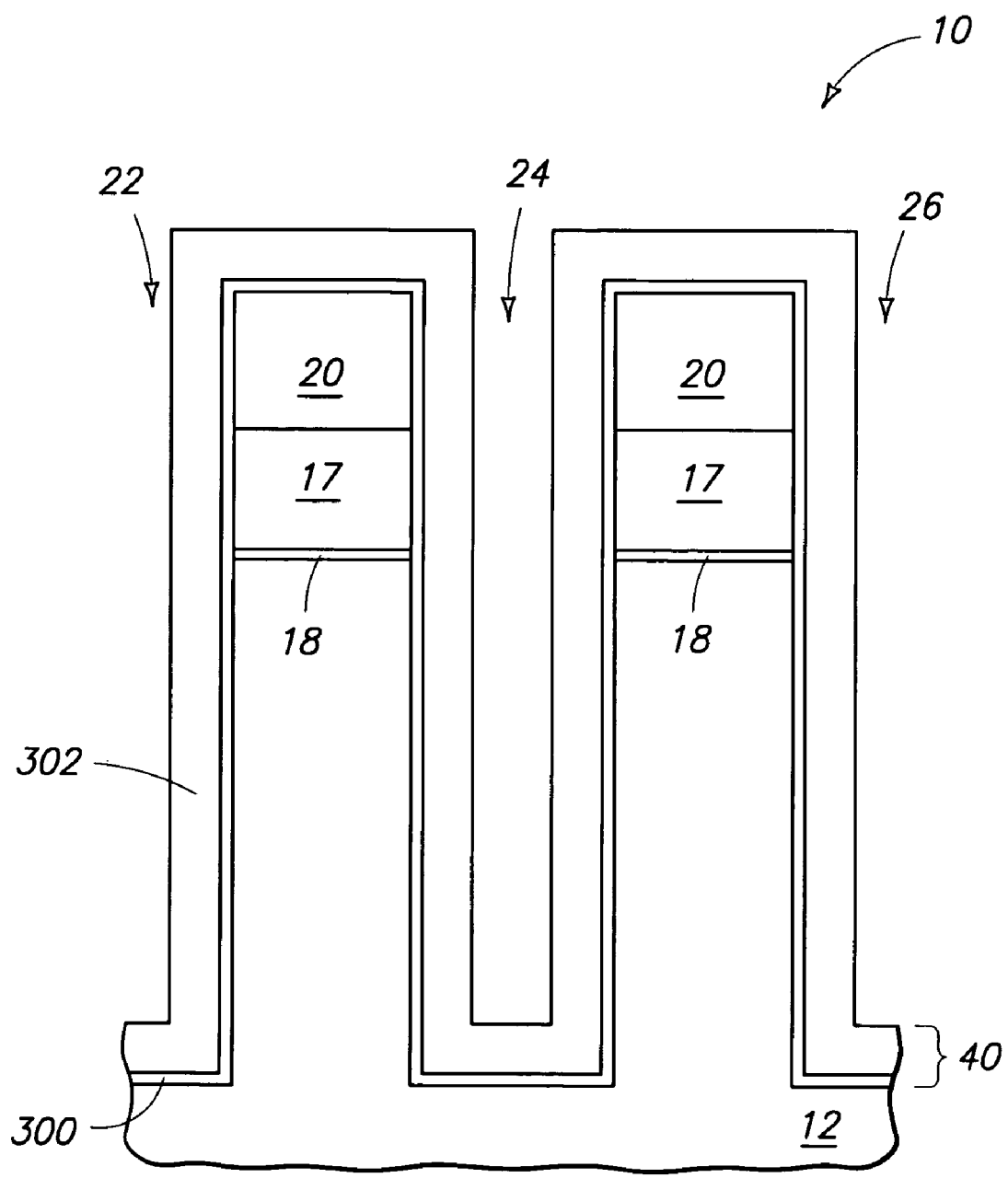
FIG. 14 is a view of the FIG. 1 wafer fragment shown at a processing stage subsequent to that of FIG. 3 in accordance with an aspect of the invention alternative to that of FIG. 5.

The aspects of the invention discussed above are exemplary aspects, and it is to be understood that the invention encompasses other embodiments. For instance, FIG. 14 shows construction 10 at a processing stage subsequent to that of FIG. 4 and alternative to that shown in FIG. 5. Identical numbering will be used in referring to FIG. 14 as was utilized above in describing FIG. 5, where appropriate.

The construction of FIG. 14 comprises the substrate 12 having trenches 22, 24 and 26 extending therein, and comprises the liner 40 extending within the trenches. However, in contrast to the embodiment of FIG. 5, the liner 40 of FIG. 14 is shown to comprise two separate layers 300 and 302. The layers can differ in composition and/or density relative to one another, and specifically layer 302 can be selectively etchable relative to layer 300. In particular aspects, layer 302 can comprise, consist essentially of, or consist of silicon dioxide, and layer 300 can comprise, consist essentially of, or consist of silicon nitride. Although liner 40 is shown to comprise two layers in the aspect of FIG. 14, it is to be understood that the liner can comprise more than two layers in other aspects of the invention. Also, it is to be understood that the relative thicknesses of the layers utilized in material 40 can be any relative thicknesses suitable for particular applications. Thus, the shown aspect in which layer 302 is thicker than layer 300 is but one exemplary aspect, and the invention includes other aspects in which layer 300 is thicker, or in which layers 300 and 302 are about the same thickness as one another.

Figure 15:
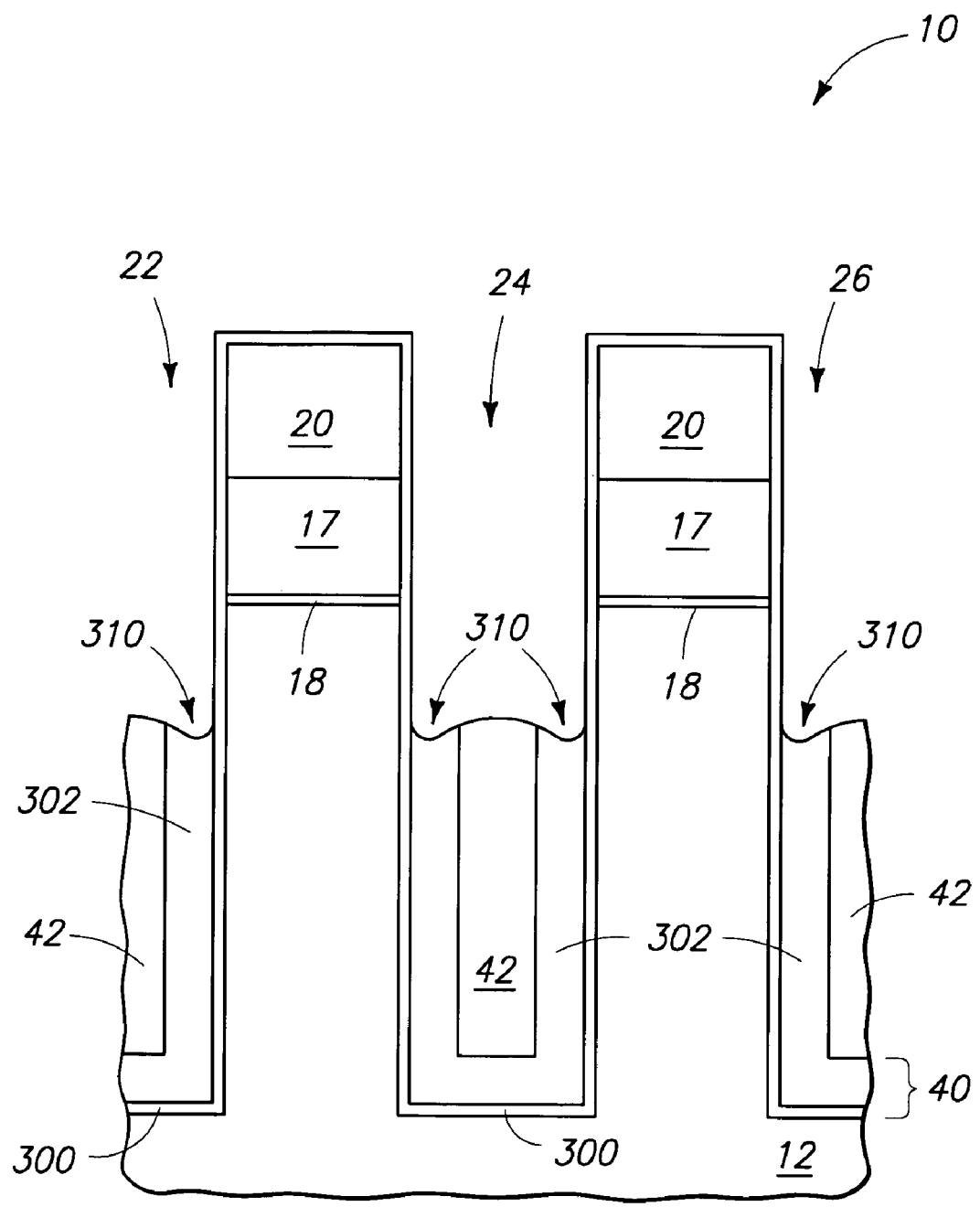
FIG. 15 is a view of the FIG. 14 wafer fragment shown at a processing stage subsequent to that of FIG. 14.

Referring next to FIG. 15, the construction of FIG. 14 is shown at a processing stage analogous to that discussed previously with reference to FIG. 8. Specifically, a sacrificial material 42 is formed within lower portions of the trenches 22, 24 and 26, and subsequently layer 40 is subjected to etching conditions which remove the portions of layer 40 that are not protected by material 42. In the shown aspect of the invention, such removal selectively removes layer 302 of material 40, but does not remove layer 300. Accordingly, layer 300 can function as an etch stop during the thinning of material 40, which can enable relatively stringent control of the final thickness of material 40 within the regions that have been thinned.

The construction 10 of FIG. 15 is shown to comprise regions 310 where etching has penetrated past an uppermost surface of sacrificial material 42 to form recesses along the material. In other words, some of the liner 40 along the sacrificial material has been reduced in thickness during the reduction in thickness of the liner which was not protected at all by the sacrificial material. In some aspects of the invention, the formation of recesses 310 can be considered to be an over-etch of the material 40 to extend the reduction in thickness of material 40 along some of the sacrificial material 42. Such over-etch can occur regardless of whether the liner 40 comprises multiple layers as shown in FIGS. 14 and 15, or comprises a single layer as shown in FIGS. 5-8. The over-etch can be desired in some aspects of the invention to alter the elevational boundary between the widened portions of material 40 and the narrowed portions of material 40 relative to where the boundaries would exist without such over-etch, and/or to change the shape of steps occurring at the interfaces of wide upper portions of the lined trenches and narrow lower portions of the lined trenches (in other words, steps analogous to the steps 63, 65 and 67 described previously).

Figure 16:
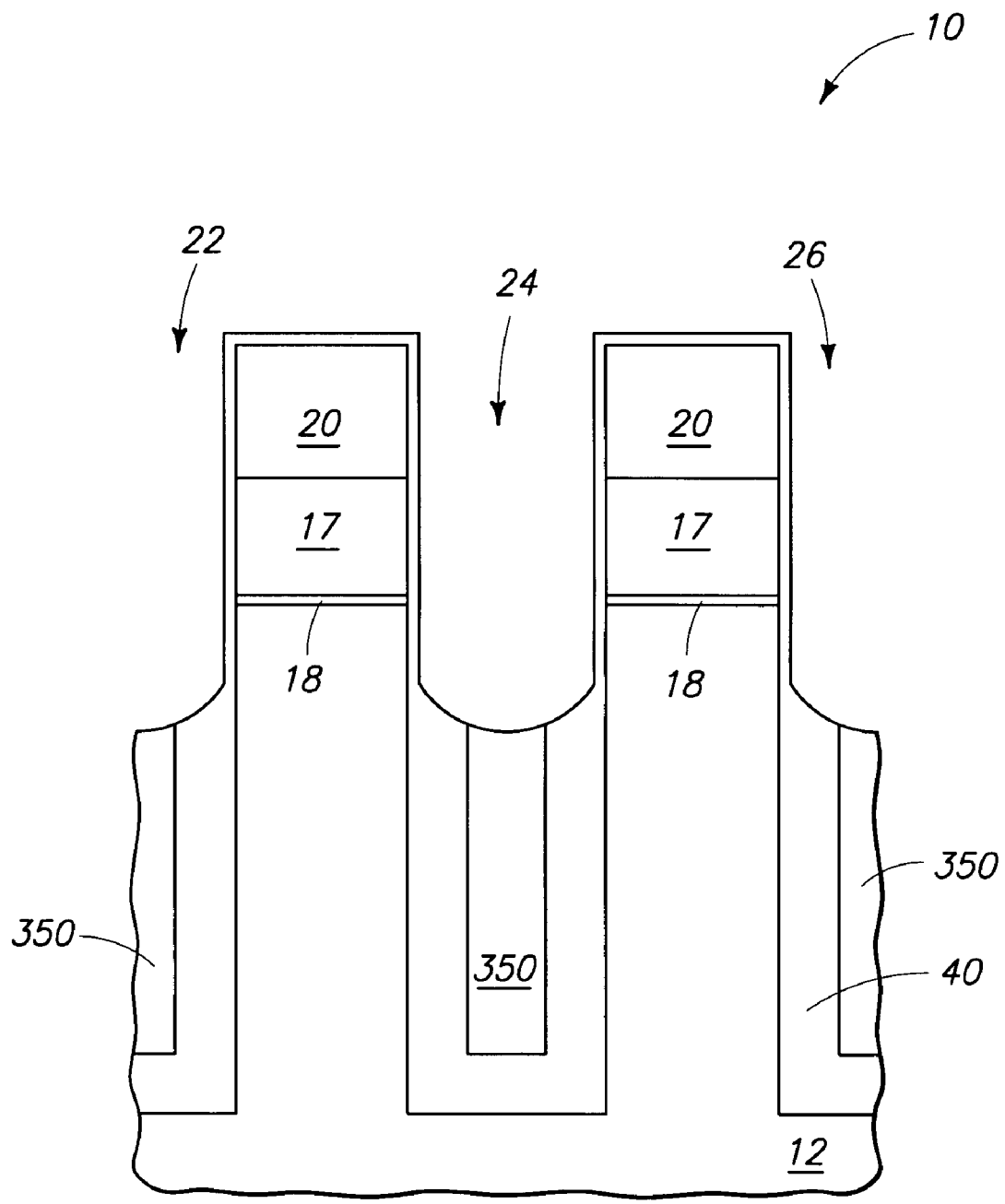
FIG. 16 is a view of the FIG. 1 wafer fragment shown at a processing stage subsequent to that of FIG. 8 shown in accordance with an aspect of the invention alternative to that discussed above with reference to FIG. 9.

FIG. 16 shows yet another aspect of the present invention. FIG. 16 shows construction 10 at a processing stage subsequent to that of FIG. 8 in accordance with an aspect of the invention alternative to that of FIG. 9. In referring to FIG. 16, identical numbering will be used as was utilized above in describing the embodiment of FIGS. 1-13, where appropriate.

The construction of FIG. 16 is identical to that of FIG. 8, except that the material 42 of FIG. 8 has been converted to a composition 350. In particular aspects of the invention, material 42 of FIG. 8 can correspond to non-oxidized silicon (such as, for example, polycrystalline silicon and/or amorphous silicon), and composition 350 of FIG. 16 can correspond to oxidized silicon (specifically silicon dioxide). Composition 350 can be formed from the non-oxidized silicon by subjecting such silicon to thermal oxidation. The oxidized silicon 350 fills lowermost regions of trenches 22, 24 and 26, and is an electrically insulative material suitable for incorporation into trenched isolation regions.

Referring next to FIG. 17, electrically insulative material 100 is formed to fill the wide portions of trenches 22, 24 and 26.

Figure 18B:
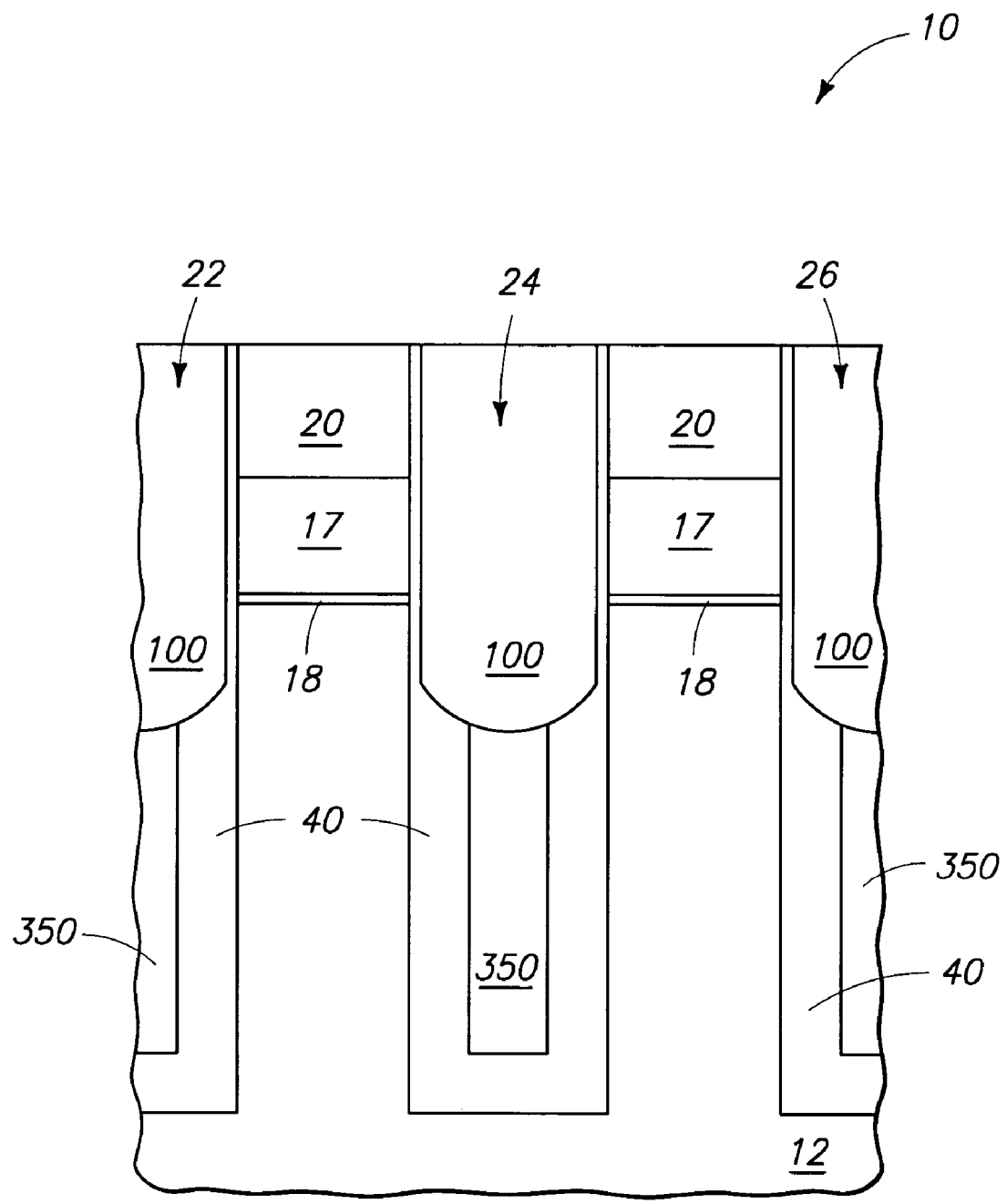
FIG. 18 is a view of the FIG. 16 wafer fragment shown at a processing stage subsequent that of FIG. 17.

In subsequent processing, the construction of FIG. 17 can be subjected to planarization to form the structure shown in FIG. 18. Such structure comprises trenched isolation regions containing insulative material 100 in combination with insulative material 350.

The processing discussed above with reference to FIGS. 1-18 is exemplary processing, and it is to be understood that the invention can include various modifications and alternative embodiments to the embodiments specifically described in FIGS. 1-18.

Figure 19:
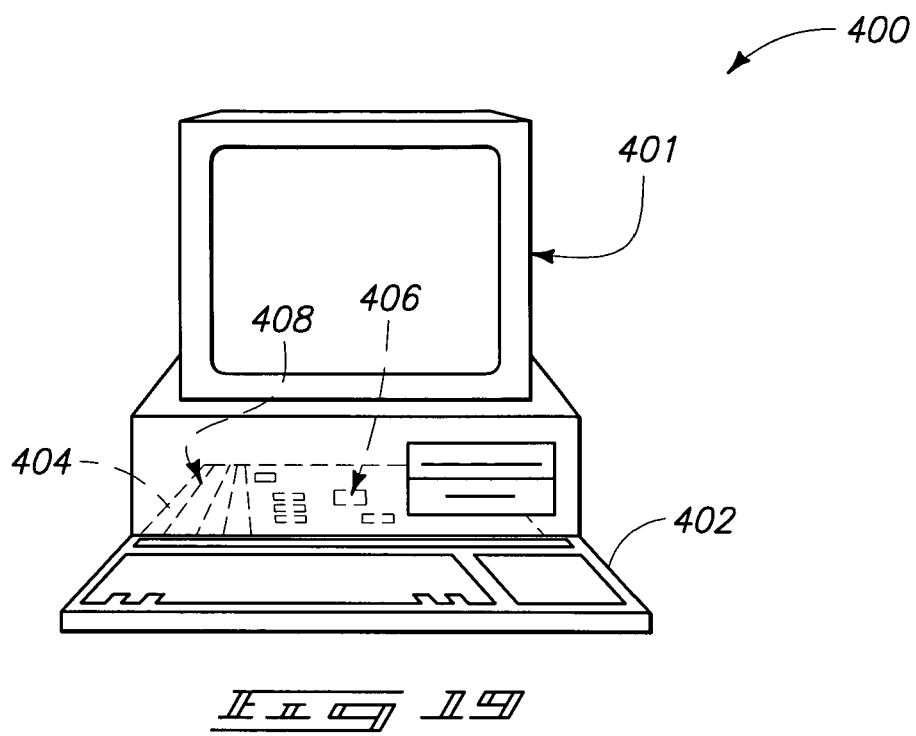
FIG. 19 is a diagrammatic view of a computer illustrating an exemplary application of the present invention.
Figure 20:
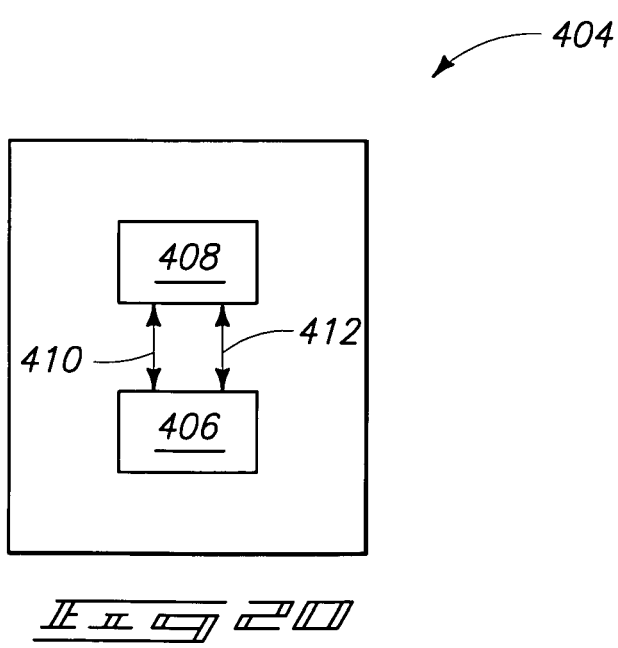
FIG. 20 is a block diagram showing particular features of the motherboard of the FIG. 19 computer.

FIG. 19 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 20. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or FLASH memories.

Memory device 408 can comprise memory formed in accordance with one or more aspects of the present invention.

Figure 21:
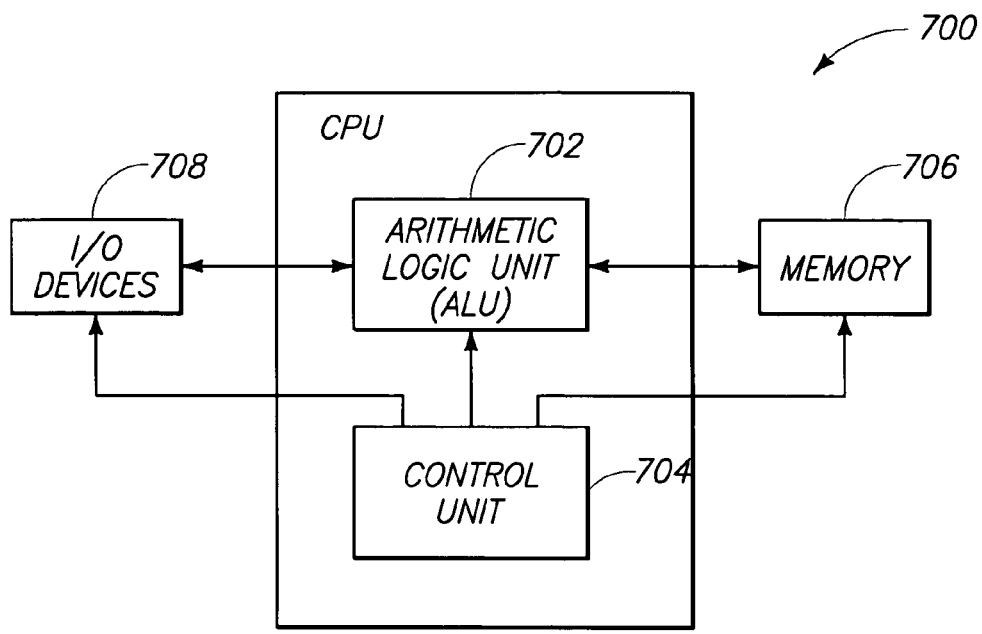
FIG. 21 is a high-level block diagram of an electronic system according to an exemplary aspect of the present invention.

FIG. 21 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 22:
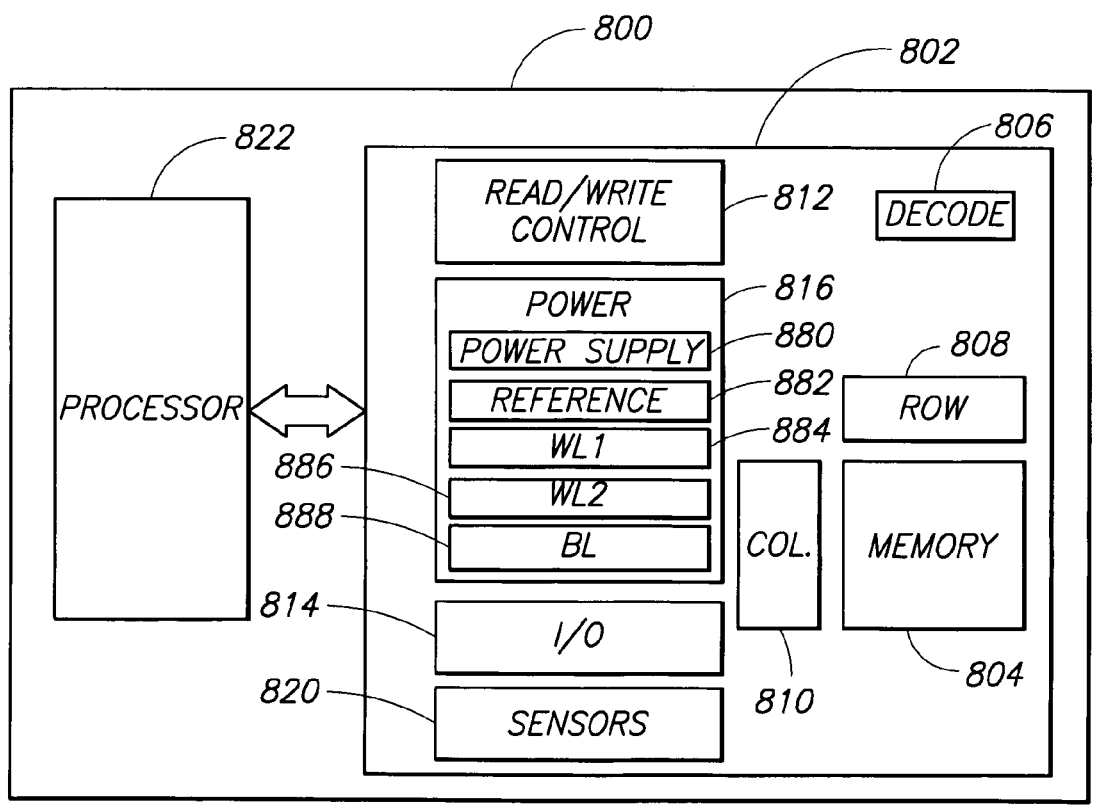
FIG. 22 is a simplified block diagram of an exemplary memory device according to an aspect of the present invention.

FIG. 22 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The isolation structures described herein can be particularly useful for incorporation in to FLASH memory, and in such aspects the FLASH can be utilized in removable memory cards and other removable memory devices. Such removable memory devices can be used for storing or transferring data for numerous electronic systems, including, for example, cameras, phones, computers, etc.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
    a semiconductor substrate;
    a trench extending into the substrate;
    a liner along an interior of the trench and narrowing the trench, the liner comprising a thick bottom portion and thin upper portion over the bottom portion, the upper portion joining the bottom portion at a step, an entirety of the thick bottom portion comprising a composition that is the same as an entirety of the thin upper portion, and the narrowed trench having a wide upper portion joining a constricted lower portion at said step;
    a first material comprising substantially solid electrically insulative material substantially filling the narrowed trench, and the first material having a different composition from the liner; and
    a second material different from the first material, the second material located in a region contained entirely within the first material and entirely within the trench, the second material spaced from the liner.

2. The construction of claim 1 wherein the liner consists of one electrically insulative composition.

3. The construction of claim 1 further comprising a void within the substantially solid insulative material; said void being at least substantially entirely within the constricted lower portion of the narrowed trench.

4. The construction of claim 1 wherein the liner comprises silicon nitride.

5. The construction of claim 1 wherein the difference between the first material and the second material comprises a difference in one or more of phase, density, and chemical composition.

6. The construction of claim 1 wherein the difference between the first and the second materials comprises a difference in phase and density.

7. The construction of claim 1 wherein the second material comprises a gaseous composition.

8. The construction of claim 1 wherein the first material comprises a density different from a density of the liner.

9. The construction of claim 1 wherein the first material comprises gelatinous materials.

10. The construction of claim 1 wherein the first material comprises multiple layers.

11. The construction of claim 1 wherein the first material comprises a homogeneous material.

12. The construction of claim 1 wherein an entirety of the second material is located below the elevational level of the step.

13. The construction of claim 1 wherein the step comprises a plurality of steps.

14. The construction of claim 1 wherein the constricted lower portion of the trench comprises a width which is less than or equal to about 70% of a width of the wide upper portion of the trench.

15. The construction of claim 1 wherein at least about 75% of a volume of the second material is retained within the constricted lower portion of the trench.

16. The construction of claim 1 wherein an entirety of the second material is retained within the constricted lower portion of the trench.

17. The construction of claim 1 wherein the second material comprises gas that is out-gassed from the first material.

18. The construction of claim 1 wherein the thick bottom portion of the liner comprises a thickness of from about 100 Å to about 200 Å.

19. A semiconductor construction, comprising:
    a semiconductor substrate;
    a trench extending into the substrate;
    a liner along an interior of the trench and narrowing the trench, the liner comprising a thick bottom portion and thin upper portion over the bottom portion, the upper portion joining the bottom portion at a step, an entirety of the thick bottom portion comprising a composition that is the same as an entirety of the thin upper portion, and the narrowed trench having a wide upper portion joining a constricted lower portion at said step; and
    a substantially solid electrically insulative material substantially filling the narrowed trench, and having a different composition from the liner.

20. The construction of claim 19 wherein the step comprises a plurality of steps.

21. The construction of claim 19 wherein the step comprises a recess.

22. A semiconductor construction, comprising:
    a semiconductor substrate;
    a trench extending into the substrate;
    a liner along an interior of the trench and narrowing the trench, the liner comprising a thick bottom portion and thin upper portion over the bottom portion, the upper portion joining the bottom portion at a step, an entirety of the thick bottom portion comprising a composition that is the same as an entirety of the thin upper portion, and the narrowed trench having a wide upper portion joining a constricted lower portion at said step; and
    gelatinous materials substantially filling the narrowed trench.

23. The construction of claim 22 wherein the step comprises a plurality of steps.

24. The construction of claim 22 wherein the step comprises a recess.

25. A semiconductor construction, comprising:
    a semiconductor substrate;
    a trench extending into the substrate;

a liner along an interior of the trench and narrowing the trench, the liner comprising a thick bottom portion and thin upper portion over the bottom portion, the upper portion joining the bottom portion at a step, the step having a recess, an entirety of the thick bottom portion comprising a composition that is the same as an entirety of the thin upper portion, and the narrowed trench having a wide upper portion joining a constricted lower portion at said step; and a substantially solid electrically insulative material substantially filling the narrowed trench, and having a different composition from the liner.

26. The construction of claim 25 wherein the substantially solid electrically insulative material comprises gelatinous materials.

27. A semiconductor construction, comprising:

a semiconductor substrate;

a trench extending into the substrate;

a liner along an interior of the trench and narrowing the trench, the liner comprising a thick bottom portion and thin upper portion over the bottom portion, the upper portion joining the bottom portion at a plurality of steps, an entirety of the thick bottom portion comprising a composition that is the same as an entirety of the thin upper portion, and the narrowed trench having a wide upper portion joining a constricted lower portion at the plurality of steps; and a substantially solid electrically insulative material substantially filling the narrowed trench, and having a different composition from the liner.

28. The construction of claim 27 wherein the substantially solid electrically insulative material comprises gelatinous materials.

29. A semiconductor construction, comprising:

a semiconductor substrate;

a trench extending into the substrate;

a liner along an interior of the trench and narrowing the trench, the liner comprising a thick bottom portion and thin upper portion over the bottom portion, the upper portion joining the bottom portion at a step, the narrowed trench having a wide upper portion joining a constricted lower portion at said step;

a first material comprising substantially solid electrically insulative material substantially filling the narrowed trench, and the first material having a different composition from the liner; and a second material different from the first material, the second material located in a region contained entirely within the first material and entirely within the trench, the second material spaced from the liner and comprising gas that is out-gassed from the first material.

30. The construction of claim 29 wherein the step comprises a plurality of steps.

31. The construction of claim 29 wherein the step comprises a recess.

* * * * *